(12) United States Patent
Leem et al.

(10) Patent No.: US 10,403,837 B2
(45) Date of Patent: Sep. 3, 2019

(54) ORGANIC PHOTOELECTRIC DEVICE AND IMAGE SENSOR

(71) Applicant: Samsung Electronics Co., Ltd., Suwon-si, Gyeonggi-do (KR)

(72) Inventors: Dong-Seok Leem, Hwaseong-si (KR); Sung Young Yun, Suwon-si (KR); Kwang Hee Lee, Yongin-si (KR); Seon-Jeong Lim, Yongin-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 147 days.

(21) Appl. No.: 15/150,930

(22) Filed: May 10, 2016

(65) Prior Publication Data

US 2017/0062747 A1   Mar. 2, 2017

(30) Foreign Application Priority Data

Aug. 26, 2015   (KR) .................. 10-2015-0120302

(51) Int. Cl.
*H01L 51/44* (2006.01)
*H01L 27/30* (2006.01)
*H01L 51/42* (2006.01)
*H01L 51/00* (2006.01)

(52) U.S. Cl.
CPC ............ *H01L 51/44* (2013.01); *H01L 27/307* (2013.01); *H01L 51/4273* (2013.01); *H01L 51/441* (2013.01); *H01L 51/0052* (2013.01); *H01L 51/424* (2013.01); *H01L 51/4206* (2013.01); *Y02E 10/549* (2013.01)

(58) Field of Classification Search
CPC ... H01L 51/441; H01L 51/44; H01L 51/4273; H01L 27/307; H01L 51/0052; H01L 51/007; H01L 51/0081; H01L 51/4206; H01L 51/424; H01L 51/50; Y02E 10/549
USPC ......... 257/40, 53, 59, 80, 87; 438/22, 24.82, 438/99
See application file for complete search history.

(56) References Cited

U.S. PATENT DOCUMENTS 7,259,405 B2 *   8/2007   Liu ...................... H01L 51/441
                                                    257/103
2005/0217722 A1   10/2005   Komatsu et al.
(Continued)

FOREIGN PATENT DOCUMENTS

JP    2006-261172 A    9/2006
KR   2014-0044848 A    4/2014
KR   2015-0042121 A    4/2015

OTHER PUBLICATIONS

Extended European Search Report dated Feb. 2, 2017 issued in corresponding European Patent Application No. 16172269.9.

*Primary Examiner* — Thinh T Nguyen
(74) *Attorney, Agent, or Firm* — Harness, Dickey & Pierce, P.L.C.

(57) ABSTRACT

An organic photoelectronic device includes an anode and a cathode facing each other, a light-absorption layer between the anode and the cathode, and a first auxiliary layer between the cathode and the light-absorption layer, the first auxiliary layer having an energy bandgap of about 3.0 eV to about 4.5 eV, and a difference between a work function of the cathode and a highest occupied molecular orbital (HOMO) energy level of the first auxiliary layer is about 1.5 eV to about 2.0 eV.

18 Claims, 9 Drawing Sheets

(56) References Cited

U.S. PATENT DOCUMENTS

| | | | |
|---|---|---|---|
| 2006/0108578 A1* | 5/2006 | Liu | H01L 51/441 |
| | | | 257/40 |
| 2007/0063156 A1 | 3/2007 | Hayashi | |
| 2007/0102698 A1* | 5/2007 | Kang | H01L 51/0072 |
| | | | 257/40 |
| 2007/0108539 A1 | 5/2007 | Brabec et al. | |
| 2007/0184575 A1* | 8/2007 | Liu | H01L 51/441 |
| | | | 438/99 |
| 2008/0227357 A1* | 9/2008 | Liu | H01L 51/5048 |
| | | | 445/1 |
| 2009/0050878 A1 | 2/2009 | Okada et al. | |
| 2009/0057659 A1* | 3/2009 | Maehara | H01L 51/4213 |
| | | | 257/40 |
| 2009/0189058 A1* | 7/2009 | Mitsui | B82Y 10/00 |
| | | | 250/208.1 |
| 2011/0012091 A1 | 1/2011 | Forrest et al. | |
| 2013/0105768 A1 | 5/2013 | Leem et al. | |
| 2014/0070189 A1* | 3/2014 | Leem et al. | H01L 51/442 |
| | | | 257/40 |
| 2014/0110696 A1 | 4/2014 | Benwadih | |
| 2014/0231949 A1 | 8/2014 | Hung et al. | |
| 2014/0239278 A1* | 8/2014 | Park | H01L 51/442 |
| | | | 257/40 |
| 2014/0346466 A1* | 11/2014 | Lee et al. | H01L 51/0072 |
| | | | 257/40 |
| 2015/0060775 A1 | 3/2015 | Liang et al. | |
| 2015/0129838 A1* | 5/2015 | Lewis | H01L 31/035218 |
| | | | 257/21 |
| 2016/0322592 A1* | 11/2016 | Park et al. | H01L 51/447 |

\* cited by examiner

ORGANIC PHOTOELECTRIC DEVICE AND IMAGE SENSOR

CROSS REFERENCE TO RELATED APPLICATION

This application claims priority to and the benefit of Korean Patent Application No. 10-2015-0120302 filed in the Korean Intellectual Property Office on Aug. 26, 2015, the entire contents of which are incorporated herein by reference.

BACKGROUND

1. Field

Example embodiments provide an organic photoelectronic device and an image sensor.

2. Description of the Related Art

A photoelectronic device converts light into an electrical signal using photoelectronic effects, and may include a photodiode, a phototransistor, etc. The photoelectronic device may be applied to an image sensor, a solar cell, an organic light emitting diode, etc.

An image sensor including a photodiode requires relatively high resolution and thus a relatively small pixel. At present, a silicon photodiode is widely used. However, the silicon photodiode may have a problem of deteriorated sensitivity because the silicon photodiode has a relatively small absorption area due to relatively small pixels. Accordingly, an organic material that is capable of replacing silicon has been researched.

The organic material has a relatively high extinction coefficient and selectively absorbs light in a particular wavelength region depending on a molecular structure, and thus may simultaneously replace a photodiode and a color filter and resultantly improve sensitivity and contribute to relatively high integration.

However, the organic material may be different from silicon due to relatively high binding energy and a recombination behavior, and thus an organic photoelectronic device including the organic material may show relatively low efficiency compared with a silicon-based photoelectronic device.

This relatively low efficiency may be solved by applying a reverse bias voltage to the organic photoelectronic device, but the organic photoelectronic device may have relatively high dark current density due to carrier charges injected therein in the reverse bias state.

In addition, the organic material may be thermally weak and thus may be deteriorated in a subsequent process requiring a relatively high temperature. Therefore, the performance of the organic photoelectronic device may be deteriorated.

SUMMARY

Example embodiments provide an organic photoelectronic device capable of reducing or preventing performance degradation by heat and lowering a dark current density.

Example embodiments also provide an image sensor including the organic photoelectronic device.

According to example embodiments, an organic photoelectronic device includes an anode and a cathode facing each other, a light-absorption layer between the anode and the cathode, and a first auxiliary layer between the cathode and the light-absorption layer, the first auxiliary layer having an energy bandgap of about 3.0 eV to about 4.5 eV, and a difference between a work function of the cathode and a highest occupied molecular orbital (HOMO) energy level of the first auxiliary layer is about 1.5 eV to about 2.0 eV.

The HOMO energy level of the first auxiliary layer may be greater than a HOMO energy level of the light-absorption layer and the work function of the cathode.

The HOMO energy level of the first auxiliary layer may be greater than or equal to about 6.3 eV.

A lowest unoccupied molecular orbital (LUMO) energy level of the first auxiliary layer may be less than a LUMO energy level of the light-absorption layer and the work function of the cathode.

The LUMO energy level of the first auxiliary layer may be greater than or equal to about 2.0 eV.

The LUMO energy level of the first auxiliary layer may be about 2.0 eV to about 2.9 eV.

The energy bandgap of the first auxiliary layer may be about 3.4 eV to about 4.3 eV.

The first auxiliary layer may include an inorganic material to provide a thin film having light transmittance of greater than or equal to about 70% by thermal evaporation.

The first auxiliary layer may include at least one of a manganese-containing oxide, a chromium-containing oxide, and a cobalt-containing oxide.

The first auxiliary layer may include one of manganese oxide, lithium manganese oxide, iron manganese oxide, cobalt manganese oxide, potassium manganese oxide, lithium chromium oxide, iron chromium oxide, cobalt chromium oxide, potassium chromium oxide, lithium cobalt oxide, iron cobalt oxide, potassium cobalt oxide, and a combination thereof.

The first auxiliary layer may have a thickness of about 0.1 nm to about 20 nm.

The organic photoelectronic device may further include a second auxiliary layer between the anode and the light-absorption layer, wherein the second auxiliary layer may include one of a molybdenum-containing oxide, a tungsten-containing oxide, a vanadium-containing oxide, a rhenium-containing oxide, a nickel-containing oxide, a copper-containing oxide, and a combination thereof.

The light-absorption layer and the first auxiliary layer may contact each other.

According to example embodiments, an organic photoelectronic device includes an anode and a cathode facing each other, a light-absorption layer between the anode and the cathode, and a first auxiliary layer between the cathode and the light-absorption layer, the first auxiliary layer including at least one of a manganese-containing oxide, a chromium-containing oxide, and a cobalt-containing oxide.

A highest occupied molecular orbital (HOMO) energy level of the first auxiliary layer may be greater than a HOMO energy level of the light-absorption layer and a work function of the cathode.

A lowest unoccupied molecular orbital (LUMO) energy level of the first auxiliary layer may be less than a LUMO energy level of the light-absorption layer and a work function of the cathode.

The first auxiliary layer may include one of manganese oxide, lithium manganese oxide, iron manganese oxide, cobalt manganese oxide, potassium manganese oxide, lithium chromium oxide, iron chromium oxide, cobalt chromium oxide, potassium chromium oxide, lithium cobalt oxide, iron cobalt oxide, potassium cobalt oxide, and a combination thereof.

The organic photoelectronic device may further include a second auxiliary layer between the anode and the light-absorption layer, wherein the second auxiliary layer includes one of a molybdenum-containing oxide, a tungsten-containing oxide, a vanadium-containing oxide, a rhenium-containing oxide, a nickel-containing oxide, a copper-containing oxide, and a combination thereof.

The light-absorption layer and the first auxiliary layer may contact each other.

According to example embodiments, an image sensor includes the organic photoelectronic device of example embodiments.

DETAILED DESCRIPTION

Figure 1:
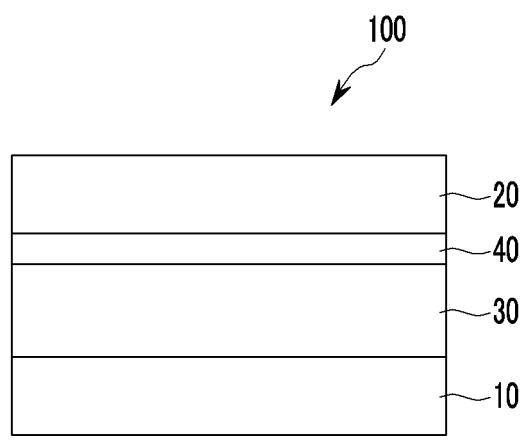
FIG. 1 is a cross-sectional view showing an organic photoelectronic device according to example embodiments.

Example embodiments will hereinafter be described in detail, and may be easily performed by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

As used herein, 'a combination thereof' refers to a mixture and a stacking structure of two or more.

As used herein, the value of an energy level such as HOMO energy level and LUMO energy level is mentioned as the absolute value of the energy level from a vacuum level.

Hereinafter, an organic photoelectronic device according to example embodiments is described with reference to drawings.

FIG. 1 is a cross-sectional view showing an organic photoelectronic device according to example embodiments.

Referring to FIG. 1, an organic photoelectronic device 100 according to example embodiments includes an anode 10 and a cathode 20 facing each other, a light-absorption layer 30 between the anode 10 and the cathode 20, and a first auxiliary layer 40 between the cathode 20 and the light-absorption layer 30.

A substrate (not shown) may be disposed on the anode 10 or the cathode 20. The substrate may be, for example, made of an inorganic material, e.g., glass, an organic material, e.g., polycarbonate, polymethylmethacrylate, polyethylene terephthalate, polyethylene naphthalate, polyamide, polyethersulfone, or a combination thereof, or a silicon wafer.

At least one of the anode 10 and the cathode 20 may be a light-transmitting electrode, and the light-transmitting electrode may be made of, for example, a conductive oxide (e.g., indium tin oxide (ITO) or indium zinc oxide (IZO)), zinc oxide (ZnO), tin oxide (SnO), aluminum tin oxide (AlTO), and fluorine doped tin oxide (FTO), or a metal thin layer of a thin monolayer or multilayer. When one of the anode 10 and the cathode 20 is a non-light-transmitting electrode, the non-light-transmitting electrode may be made of, for example, an opaque conductor, e.g., aluminum (Al), silver (Ag), and/or gold (Au). For example, the anode 10 and the cathode 20 may be light-transmitting electrodes.

The light absorption layer 30 includes a p-type semiconductor and a n-type semiconductor to form a heterojunction (bulk heterojunction), and absorbs external light to generate excitons and then separates the generated excitons into holes and electrons.

The light-absorption layer 30 may absorb light in at least one wavelength region, and may selectively absorb, for example, light in a visible ray wavelength region, for example, one part of green light of about 500 nm to about 600 nm, blue light of greater than or equal to about 380 nm and less than about 500 nm, and red light of greater than about 600 nm and less than or equal to about 780 nm.

For example, at least one of the p-type semiconductor and n-type semiconductor may be a light-absorbing material selectively absorbing one of green light, blue light, and red light.

For example, the light-absorbing material selectively absorbing green light may be, for example, quinacridone or a derivative thereof, subphthalocyanine or a derivative thereof, thiophene or a derivative thereof, polythiophene or a derivative thereof, or a compound represented by Chemical Formula 1, but is not limited thereto.

[Chemical Formula 1]

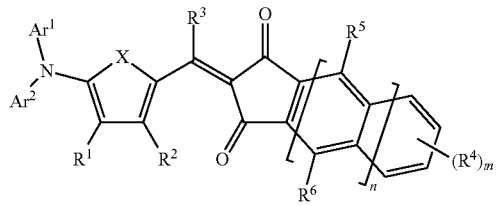

In Chemical Formula 1,

X is one of Se, Te, S(=O), S(=O)$_2$, and SiR$^a$R$^b$ (wherein R$^a$ and R$^b$ are one of hydrogen and a C$_1$ to C$_{10}$ alkyl group), each of Ar$^1$ and Ar$^2$ are independently one of a substituted or unsubstituted C$_6$ to C$_{30}$ aryl group and a substituted or unsubstituted C$_4$ to C$_{30}$ heteroaryl group, each of R$^1$ to R$^6$ are independently one of hydrogen, a substituted or unsubstituted C$_1$ to C$_{30}$ alkyl group, a substituted or unsubstituted C$_6$ to C$_{30}$ aryl group, a substituted or unsubstituted C$_4$ to C$_{30}$ heteroaryl group, a halogen, and CN, m is an integer ranging from 0 to 4, and n is 0 or 1.

The compound represented by Chemical Formula 1 may be, for example, a compound represented by Chemical Formula 1A.

[Chemical Formula 1A]

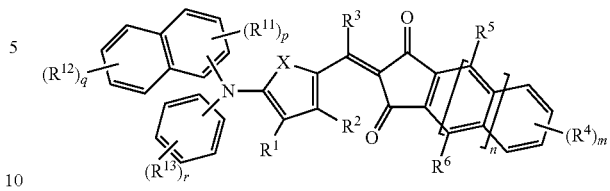

In Chemical Formula 1A,

X is one of Se, Te, S(=O), S(=O)$_2$, and SiR$^a$R$^b$ (wherein R$^a$ and R$^b$ are one of hydrogen and a C$_1$ to C$_{10}$ alkyl group), each of R$^1$ to R$^6$ are independently one of hydrogen, a substituted or unsubstituted C$_1$ to C$_{30}$ alkyl group, a substituted or unsubstituted C$_6$ to C$_{30}$ aryl group, a substituted or unsubstituted C$_4$ to C$_{30}$ heteroaryl group, a halogen, CN, and combination thereof, m is an integer ranging from 0 to 4, n is 0 or 1, each of R$^{11}$ to R$^{13}$ are independently one of hydrogen, a halogen, CN, a C$_1$ to C$_6$ alkyl group, a C$_1$ to C$_6$ alkoxy group, and a combination thereof, p is an integer ranging from 0 to 3, q is an integer ranging from 0 to 4, and r is an integer ranging from 0 to 5.

The compound represented by Chemical Formula 1 may be, for example, a compound represented by one of Chemical Formulae 1-1 to 1-16, but is not limited thereto.

[Chemical Formula 1-1]

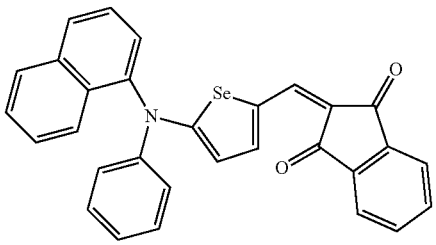

[Chemical Formula 1-2]

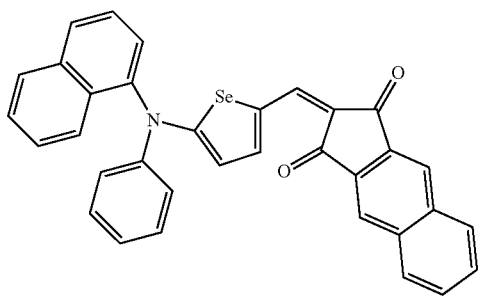

-continued
[Chemical Formula 1-3]
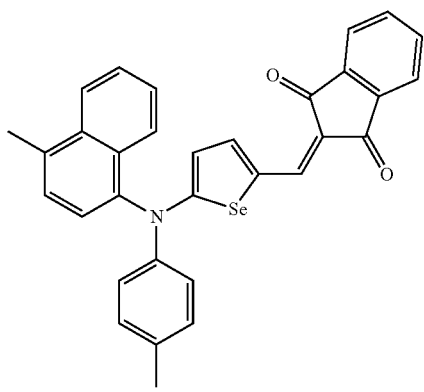
[Chemical Formula 1-4]
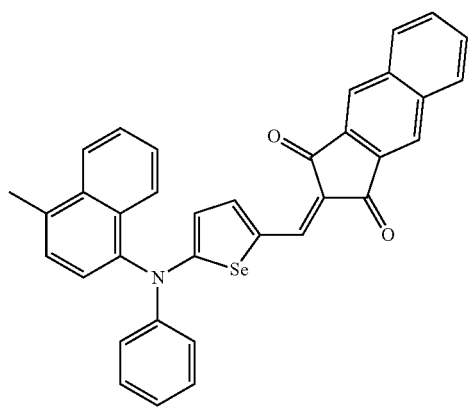
[Chemical Formula 1-5]
[Chemical Formula 1-6]
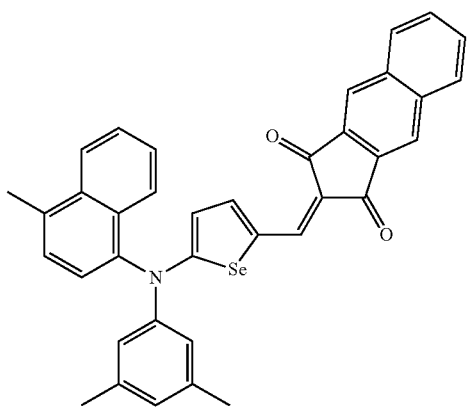
[Chemical Formula 1-7]
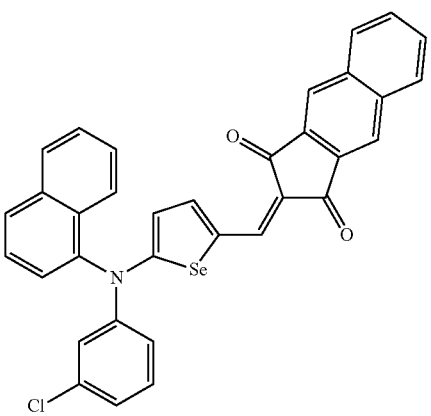
[Chemical Formula 1-8]

[Chemical Formula 1-9]

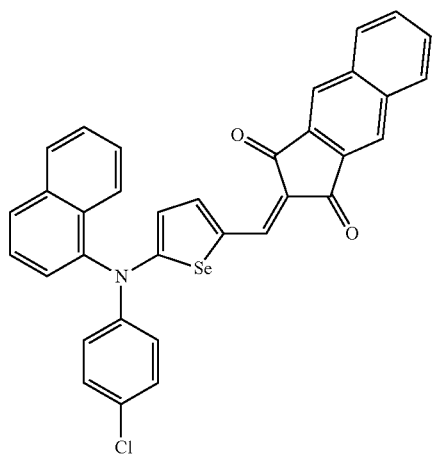

[Chemical Formula 1-10]

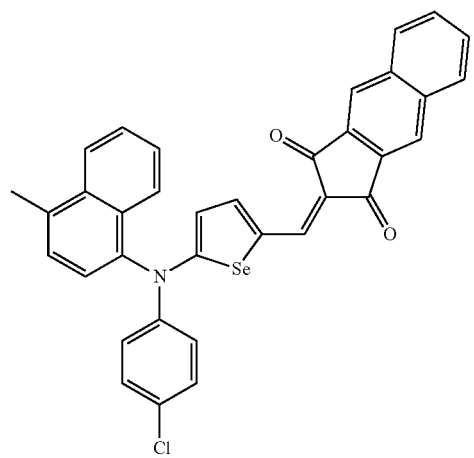

[Chemical Formula 1-11]

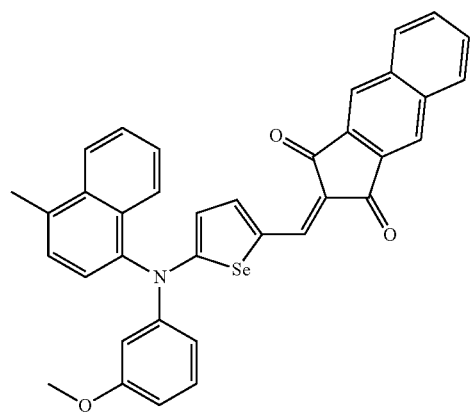

[Chemical Formula 1-12]

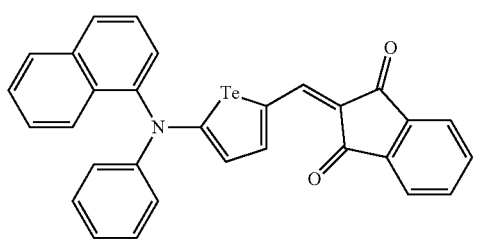

[Chemical Formula 1-13]

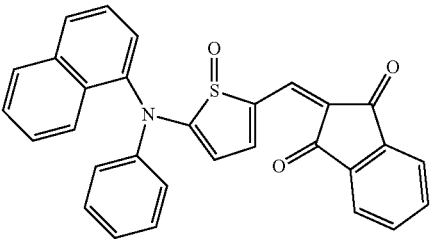

[Chemical Formula 1-14]

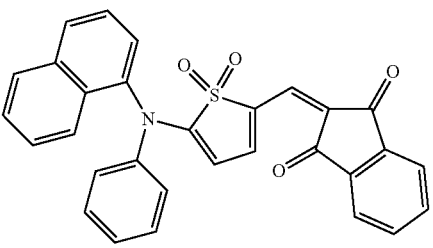

[Chemical Formula 1-15]

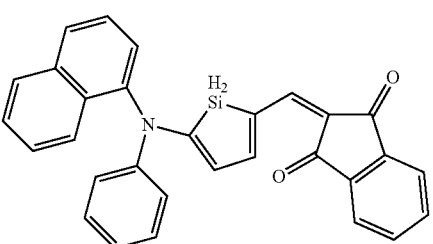

[Chemical Formula 1-16]

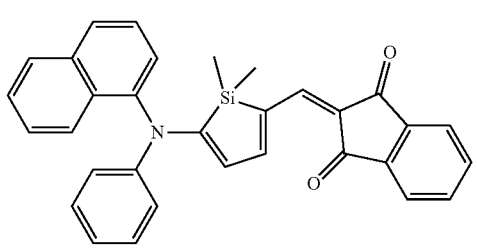

The light-absorption layer 30 may include an intrinsic layer (1 layer), and a p-type semiconductor and an n-type semiconductor of the intrinsic layer may be mixed in a volume ratio of about 10:1 to about 1:10, for example, about 8:2 to about 2:8 or about 6:4 to about 4:6. The light-absorption layer 30 may further include a p-type layer and/or an an n-type layer on one side or both sides of the intrinsic layer, the p-type layer may include a p-type semiconductor, and the n-type layer may include an n-type semiconductor. For example, the light-absorption layer 30 may include a p-type layer/1 layer, an 1 layer/n-type layer, a p-type layer/1 layer/n-type layer, etc.

The light-absorption layer 30 may include a p-type layer and an n-type layer. The p-type layer may include a p-type semiconductor, and the n-type layer may include an n-type semiconductor.

The light-absorption layer 30 may have a thickness of about 1 nm to about 500 nm, and specifically, about 5 nm to about 300 nm. When the light-absorption layer 30 has a thickness within the range, the active layer may effectively absorb light, effectively separate holes and electrons, and deliver them, thereby effectively improving photoelectronic conversion efficiency.

The first auxiliary layer 40 is positioned between the cathode 20 and the light-absorption layer 30, and may contact, for example, the light-absorption layer 30.

The first auxiliary layer 40 may reduce or prevent reverse transfer of holes, from the cathode 20 to the light-absorption layer 30, that is, leakage of holes, when a reverse bias is applied to the organic photoelectronic device 100.

Figure 2:
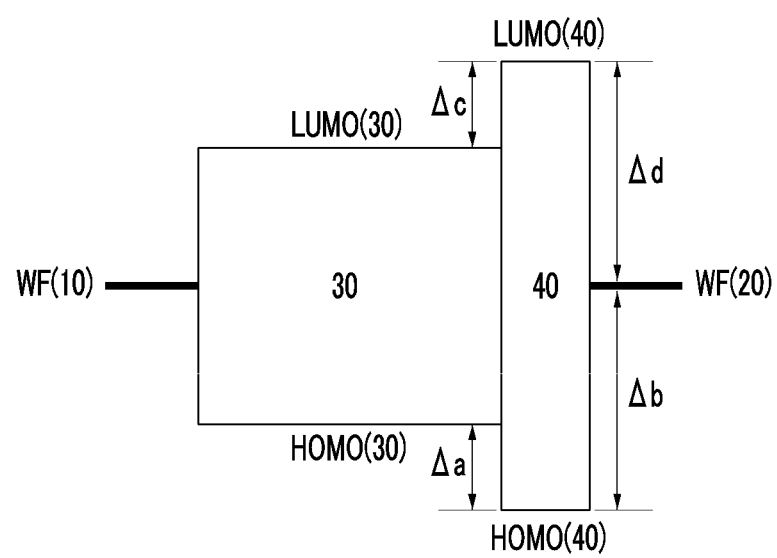
FIG. 2 is a schematic diagram showing an energy level of the organic photoelectronic device of FIG. 1.

FIG. 2 is a schematic diagram showing an energy level of the organic photoelectronic device of FIG. 1.

Referring to FIG. 2, an energy bandgap of the first auxiliary layer 40 may be greater than a bandgap of the light-absorption layer 30. For example, the energy bandgap of the first auxiliary layer 40 may be about 3.0 eV to about 4.5 eV, for example, about 3.2 eV to 4.3 eV, or for example, about 3.4 eV to 4.3 eV.

For example, the HOMO energy level of the first auxiliary layer 40 may be greater than the HOMO energy level of the light-absorption layer 30, and a LUMO energy level of the first auxiliary layer 40 may be less than the LUMO energy level of the light-absorption layer 30.

For example, the HOMO energy level of the first auxiliary layer 40 may be greater than the HOMO energy level of the light-absorption layer 30 and the work function (WF) of the cathode 20.

For example, a difference (Δa) between the HOMO energy level of the first auxiliary layer 40 and the HOMO energy level of the light-absorption layer 30 may be about 0.1 eV to about 1.0 eV, for example about 0.2 eV to about 0.7 eV.

For example, a difference (Δb) between the HOMO energy level of the first auxiliary layer 40 and the work function (WF) of the cathode 20 may be about 1.5 eV to about 2.0 eV.

The first auxiliary layer 40 may reduce or prevent reverse transfer of holes, from the cathode 20 to the light-absorption layer 30, that is, leakage of holes, by having the HOMO energy level satisfying the energy gap between the light-absorption layer 30 and the cathode 20, when a reverse bias is applied to the organic photoelectronic device 100.

For example, the HOMO energy level of the first auxiliary layer 40 may be greater than or equal to about 6.3 eV, for example about 6.3 eV to about 6.9 eV.

For example, the LUMO energy level of the first auxiliary layer 40 may be less than the LUMO energy level of the light-absorption layer 30 and the work function (WF) of the cathode 20.

For example, a difference (Δc) between the LUMO energy level of the first auxiliary layer 40 and the LUMO energy level of the light-absorption layer 30 may be about 0.1 eV to about 2.0 eV, for example about 0.2 eV to about 1.5 eV.

For example, a difference (Δd) between the LUMO energy level of the first auxiliary layer 40 and the work function (WF) of the cathode 20 may be about 1.5 eV to about 2.8 eV, for example about 1.8 eV to about 2.4 eV.

When the first auxiliary layer 40 has an LUMO energy level between the light-absorption layer 30 and the cathode 20 within the range, electron extraction from the light-absorption layer 30 to the cathode 20 may be easily made and high efficiency may be obtained.

For example, the LUMO energy level of the first auxiliary layer 40 may be greater than or equal to about 2.0 eV, for example, about 2.0 eV to about 3.2 eV, or about 2.0 eV to about 2.9 eV.

On the other hand, the first auxiliary layer 40 may be formed of a material satisfying the aforementioned energy level and simultaneously being thermally deposited and thus having a given (or alternatively, predetermined) light transmittance. For example, the first auxiliary layer 40 may include an inorganic material to provide a thin film having light transmittance of greater than or equal to about 70% by thermal evaporation. Within the light transmittance range, the first auxiliary layer 40 may include an inorganic material to provide a thin film having light transmittance of greater than and equal to about 80%, for example, greater than and equal to about 85%.

In this way, the first auxiliary layer 40 includes an inorganic material thermally-deposited and having light transmittance and thus may reduce or prevent thermal and physical damage on the light-absorption layer 30 in a process of forming the first auxiliary layer 40 and/or its subsequent process as well as effectively perform an electron extraction function and a hole leakage-blocking function, and resultantly, reduce or prevent performance degradation of the organic photoelectronic device 100 due to the degradation of the light-absorption layer 30.

If the first auxiliary layer 40 is formed through physical deposition such as sputtering, the organic material of the light-absorption layer 30 is damaged in the process of forming the first auxiliary layer 40, deteriorating performance of the organic photoelectronic device 100. In addition, if the first auxiliary layer 40 is thermally deposited and thus loses light transmittance, light inflowing from the cathode 20 may not be effectively transferred to the light-absorption layer 30, deteriorating performance of the organic photoelectronic device 100. Furthermore, if the first auxiliary layer 40 is formed of an organic material rather than an inorganic material, the first auxiliary layer 40 may be degraded in a subsequent process requiring a high temperature or not reduce or prevent degradation of the light-absorption layer 30 and thus deteriorate performance of the organic photoelectronic device 100.

The first auxiliary layer 40 may include an inorganic material satisfying the above characteristics, for example, at least one of a manganese-containing oxide, a chromium-containing oxide, and a cobalt-containing oxide.

The first auxiliary layer 40 may include, for example, manganese oxide, lithium manganese oxide, iron manganese oxide, cobalt manganese oxide, potassium manganese oxide, lithium chromium oxide, iron chromium oxide, cobalt chromium oxide, potassium chromium oxide, lithium cobalt oxide, iron cobalt oxide, potassium cobalt oxide, or a combination thereof, but is not limited thereto.

The first auxiliary layer 40 may have a thickness of about 0.1 nm to about 20 nm. When the thickness is within the range, external quantum efficiency (EQE) may not only be improved, but a leakage current may also be decreased. Within the range, the thickness may be, for example, in a range of about 1 nm to about 10 nm, in a range of about 1 nm to about 8 nm, or in a range of about 1 nm to about 5 nm.

The organic photoelectronic device 100 may further include a buffer layer (not shown) between the first auxiliary layer 40 and the cathode 20. The buffer layer may include, for example, an organic material, an inorganic material, or an organic/inorganic material, and improves charge mobility.

The organic photoelectronic device 100 may further include a third auxiliary layer (not shown) on the anode 10 or the cathode 20.

The third auxiliary layer is disposed at a light incidence side, decreases reflectance of incident light, and improves a light absorption degree. For example, when light enters trough the anode 10, the third auxiliary layer may be disposed under the anode 10, while when light enters at the cathode 20, the third auxiliary layer may be disposed on the cathode 20.

The third auxiliary layer may include, for example, a material having a refractive index of about 1.6 to about 2.5, for example, at least one of a metal oxide, a metal sulfide, and an organic material that have a refractive index within the range. The third auxiliary layer may include, for example, a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof, a metal sulfide such as zinc sulfide, or an organic material such as an amine derivative, but is not limited thereto.

Hereinafter, an organic photoelectronic device according to example embodiments is described.

Figure 3:
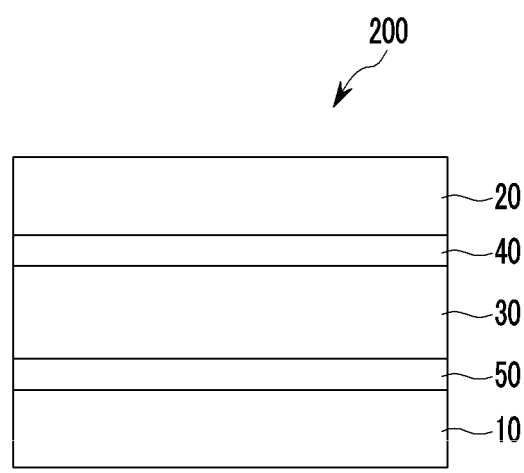
FIG. 3 is a cross-sectional view showing an organic photoelectronic device according to example embodiments.

FIG. 3 is a cross-sectional view showing an organic photoelectronic device according to example embodiments.

Referring to FIG. 3, an organic photoelectronic device 200 according to example embodiments includes an anode 10 and a cathode 20 facing each other, a light-absorption layer 30 between the anode 10 and the cathode 20, and a first auxiliary layer 40 between the cathode 20 and the light-absorption layer 30, like the example embodiment illustrated in FIG. 1.

However, the organic photoelectronic device 200 according to example embodiments further includes a second auxiliary layer (or oxide layer) 50 between the anode 10 and the light-absorption layer 30, unlike the example embodiment illustrated in FIG. 1.

The second auxiliary layer (or oxide layer) 50 is positioned between the anode 10 and the light-absorption layer 30, and for example, contacts the anode 10.

The second auxiliary layer (or oxide layer) 50 may increase transfer of holes, from the light-absorption layer 30 to the anode 10, and may effectively improves hole extraction and simultaneously reduce or prevent reverse transfer of electrons from the anode 10 to the light-absorption layer 30, that is, leakage of electrons, when a reverse bias is applied.

Accordingly, the second auxiliary layer (or oxide layer) 50 may further improve efficiency and decrease dark current of the organic photoelectronic device 200 along with the first auxiliary layer 40.

Figure 4:
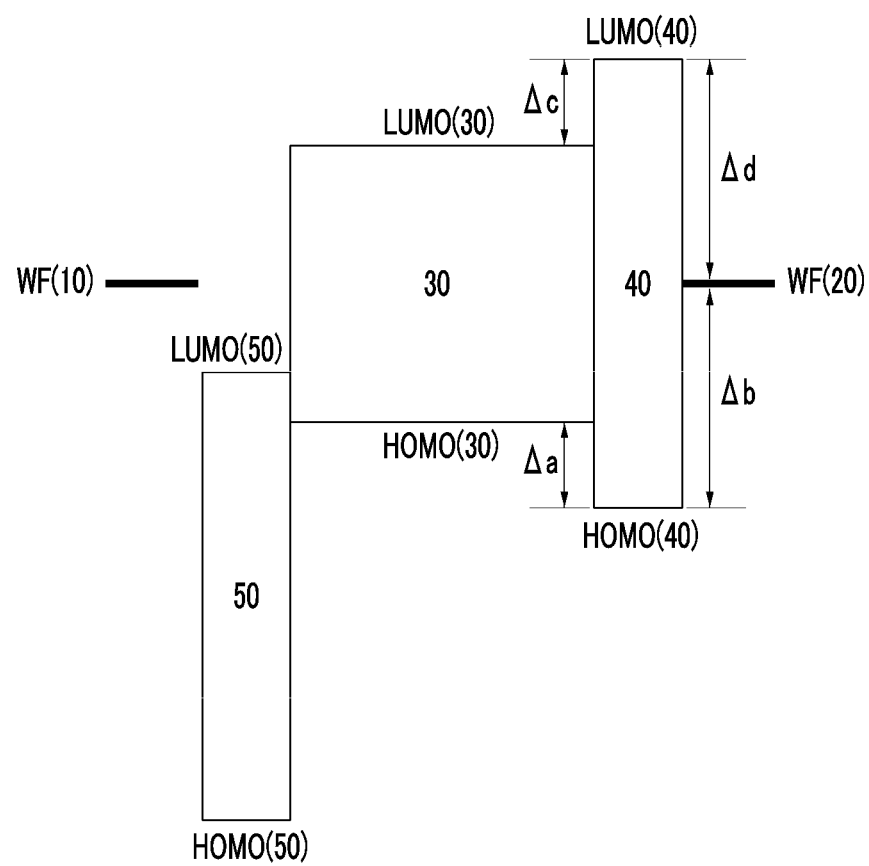
FIG. 4 is a schematic diagram showing an energy level of the organic photoelectronic device of FIG. 3.

FIG. 4 is a schematic diagram showing an energy level of the organic photoelectronic device of FIG. 3.

Referring to FIG. 4, an energy bandgap of the first auxiliary layer 40 may be greater than an energy bandgap of the light-absorption layer 30. For example, the energy bandgap of the first auxiliary layer 40 may be about 3.0 eV to about 4.5 eV, for example about 3.2 eV to 4.3 eV, or for example about 3.4 to 4.3 eV.

For example, the HOMO energy level of the first auxiliary layer 40 may be greater than the HOMO energy level of the light-absorption layer 30, and a LUMO energy level of the first auxiliary layer 40 may be less than the LUMO energy level of the light-absorption layer 30.

For example, the HOMO energy level of the first auxiliary layer 40 may be greater than the HOMO energy level of the light-absorption layer 30 and the work function (WF) of the cathode 20.

For example, a difference ($\Delta a$) between the HOMO energy level of the first auxiliary layer 40 and the HOMO energy level of the light-absorption layer 30 may be about 0.1 eV to about 1.0 eV, for example about 0.2 eV to about 0.7 eV.

For example, a difference ($\Delta b$) between the HOMO energy level of the first auxiliary layer 40 and the work function (WF) of the cathode 20 may be about 1.5 eV to about 2.0 eV.

The first auxiliary layer 40 may reduce or prevent reverse transfer of holes, from the cathode 20 to the light-absorption layer 30, that is, leakage of holes, by having the HOMO energy level satisfying the energy gap between the light-absorption layer 30 and the cathode 20, when a reverse bias is applied to the organic photoelectronic device 100.

For example, the HOMO energy level of the first auxiliary layer 40 may be greater than or equal to about 6.3 eV, for example about 6.3 eV to about 6.9 eV.

For example, the LUMO energy level of the first auxiliary layer 40 may be less than the LUMO energy level of the light-absorption layer 30 and the work function (WF) of the cathode 20.

For example, a difference ($\Delta c$) between the LUMO energy level of the first auxiliary layer 40 and the LUMO energy level of the light-absorption layer 30 may be about 0.1 eV to about 2.0 eV, for example about 0.2 eV to about 1.5 eV.

For example, a difference ($\Delta d$) between the LUMO energy level of the first auxiliary layer 40 and the work function (WF) of the cathode 20 may be about 1.5 eV to about 2.8 eV, for example about 1.8 eV to about 2.4 eV.

When the first auxiliary layer 40 has a LUMO energy level between the light-absorption layer 30 and the cathode 20 within the range, electron extraction from the light-absorption layer 30 to the cathode 20 may be easily made and high efficiency may be obtained.

For example, the LUMO energy level of the first auxiliary layer 40 may be greater than or equal to about 2.0 eV, for example about 2.0 eV to about 3.2 eV, or about 2.0 eV to about 2.9 eV.

For example, an energy bandgap of the second auxiliary layer (or oxide layer) 50 may be about 2.2 eV to about 4.0 eV, for example about 2.5 eV to about 3.7 eV, or for example about 2.8 eV to about 3.5 eV.

For example, a HOMO energy level of the second auxiliary layer (or oxide layer) 50 may be greater than the HOMO energy level of the light-absorption layer 30 and the work function (WF) of the anode 10. For example, the HOMO energy level of the second auxiliary layer (or oxide layer) 50 may be greater than or equal to about 7.0 eV, for example about 7.0 eV to about 9.5 eV.

For example, a LUMO energy level of the second auxiliary layer (or oxide layer) 50 may be greater than the LUMO energy level of the light-absorption layer 30 and the work function (WF) of the cathode 20. For example, the LUMO energy level of the second auxiliary layer (or oxide layer) 50 may be greater than or equal to about 5.0 eV, for example about 5.0 eV to about 6.3 eV.

By having the energy level satisfying the energy gap between the light-absorption layer 30 and the anode 10, hole extraction from the light-absorption layer 30 to the anode 10 may increase, and the second auxiliary layer (or oxide layer) 50 may reduce or prevent reverse transfer of electrons, from the anode 10 to the light-absorption layer 30, that is, leakage of electrons, when a reverse bias is applied to the organic photoelectronic device 100.

The second auxiliary layer (or oxide layer) 50 may include, for example, a molybdenum-containing oxide, a tungsten-containing oxide, a vanadium-containing oxide, a rhenium-containing oxide, a nickel-containing oxide, a copper-containing oxide, or a combination thereof, but is not limited thereto.

The second auxiliary layer (or oxide layer) 50 may have a thickness of about 1 nm to about 50 nm, for example about 1 nm to about 40 nm, or for example about 1 nm to about 35 nm.

A buffer layer (not shown) may be further present between the first auxiliary layer 40 and the cathode 20 and/or the second auxiliary layer (or oxide layer) 50 and the light-absorption layer 30. The buffer layer may include, for example, an organic material, an inorganic material, or an organic/inorganic material, and improves charge mobility.

The organic photoelectronic device 200 may further include a third auxiliary layer (not shown) on the anode 10 or the cathode 20.

The third auxiliary layer may be disposed on a light incidence side, decrease reflectance of incident light, and improves a light absorption degree. For example, when light enters through the anode 10, the third auxiliary layer may be disposed under the anode 10, while when light enters at the cathode 20, the third auxiliary layer may be disposed on the cathode 20.

The third auxiliary layer may include, for example, a material having a refractive index of about 1.6 to about 2.5, for example at least one of metal oxide, metal sulfide, and an organic material that have a refractive index within the range. The third auxiliary layer may include, for example a metal oxide, e.g., an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof, a metal sulfide, e.g., zinc sulfide, or an organic material, e.g., an amine derivative, but is not limited thereto.

The organic photoelectronic device may be applied to a solar cell, an image sensor, a photo-detector, a photo-sensor, and an organic light emitting diode (OLED), but is not limited thereto.

The organic photoelectronic device may be, for example, applied to an image sensor.

Hereinafter, an example of an image sensor including the organic photoelectronic device is described referring to drawings. As an example of an image sensor, an organic CMOS image sensor is described.

Figure 5:
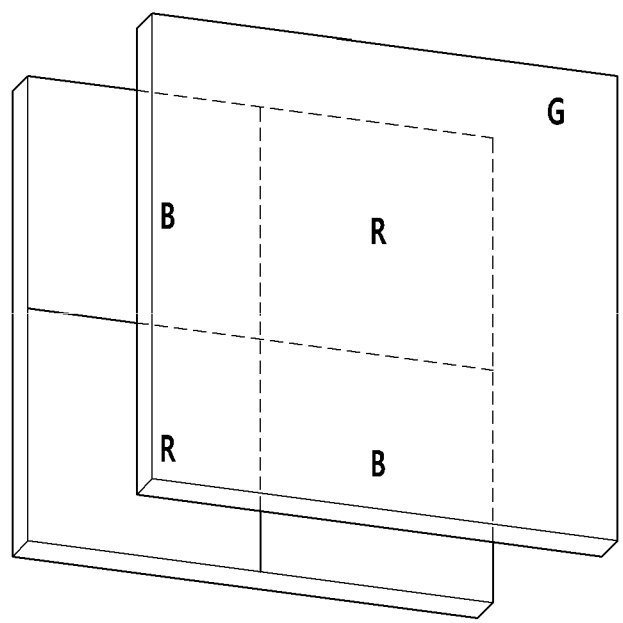
FIG. 5 is a top plan view showing an organic CMOS image sensor according to example embodiments.
Figure 6:
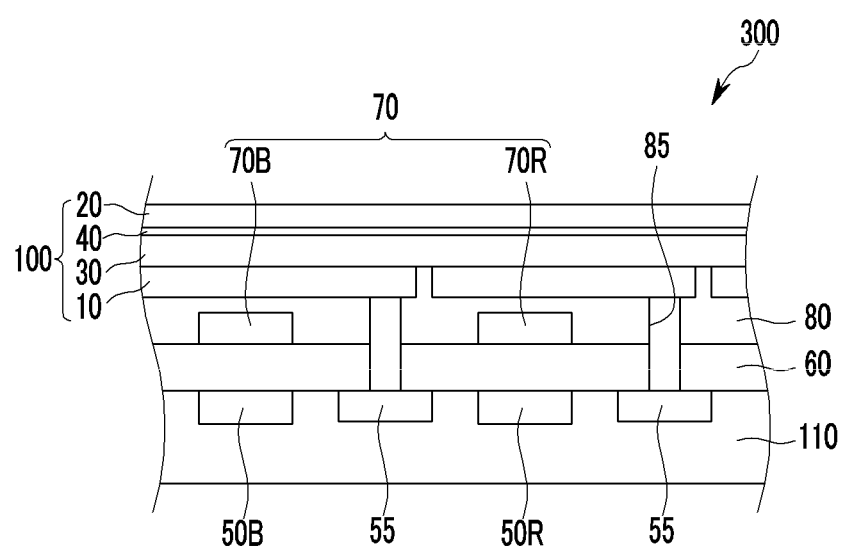
FIG. 6 is a cross-sectional view showing the organic CMOS image sensor of FIG. 5.

FIG. 5 is a schematic top plan view showing an organic CMOS image sensor according to example embodiments, and FIG. 6 is a cross-sectional view showing the organic CMOS image sensor of FIG. 5.

Referring to FIGS. 5 and 6, an organic CMOS image sensor 300 according to example embodiments includes a semiconductor substrate 110 integrated with photo-sensing devices 50B and 50R, a transmission transistor (not shown), and a charge storage device 55, a lower insulation layer 60, a color filter layer 70, an upper insulation layer 80, and an organic photoelectronic device 100.

The semiconductor substrate 110 may be a silicon substrate, and is integrated with the photo-sensing devices 50B and 50R, the transmission transistor (not shown), and the charge storage device 55. The photo-sensing devices 50B and 50R may be a photodiode.

The photo-sensing devices 50B and 50R, the transmission transistor, and/or the charge storage device 55 may be integrated in each pixel, and as shown in the drawing, the photo-sensing devices 50B and 50R may be included in each blue pixel and red pixel, while the charge storage device 55 may be included in a green pixel as well as each blue pixel and red pixel.

The photo-sensing devices 50B and 50R sense light, the information sensed by the photo-sensing devices may be transferred by the transmission transistor, the charge storage device 55 is electrically connected with the organic photoelectronic device 100 that will be described later, and the information of the charge storage device 55 may be transferred by the transmission transistor.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but is not limited thereto. However, it is not limited to the structure, and the metal wire and pad may be positioned under the photo-sensing devices 50B and 50R.

The lower insulation layer 60 is formed on the metal wire and the pad. The lower insulation layer 60 may be made of an inorganic insulating material, e.g., a silicon oxide and/or a silicon nitride, or a low dielectric constant (low K) material, e.g., SiC, SiCOH, SiCO, and SiOF. The lower insulation layer 60 has a trench exposing the charge storage 55. The trench may be filled with fillers.

The color filter layer 70 is formed on the lower insulation layer 60. The color filter layer 70 includes a blue filter 70B formed in the blue pixel and a red filter 70R filled in the red pixel. In example embodiments, a green filter is not included, but a green filter may be further included.

The upper insulation layer 80 is formed on the color filter layer 70. The upper insulation layer 80 may eliminate a step caused by the color filter layer 70 and smoothes the surface. The upper insulation layer 80 and lower insulation layer 60 may include a contact hole (not shown) exposing a pad, and a through-hole 85 exposing the charge storage device 55 of a green pixel.

The organic photoelectronic device 100 is formed on the upper insulation layer 80. The organic photoelectronic device 100 includes an anode 10, a light-absorption layer 30, a first auxiliary layer 40, and a cathode 20 as described above. In the drawing, the anode 10, the light-absorption layer 30, the first auxiliary layer 40, and the cathode 20 are sequentially stacked, but the present inventive concepts are not limited thereto, and the cathode 20, the first auxiliary layer 40, the light-absorption layer 30, and the anode 10 may be deposited in order.

The anode 10 and the cathode 20 may be transparent electrodes, and the light-absorption layer 30 is the same as described above. The light-absorption layer 30 may selectively absorb light in a green wavelength region and replace a green filter of a green pixel.

When light enters from the cathode 20, the light in a green wavelength region may be mainly absorbed in the light-absorption layer 30 and photoelectronically converted, while the light in the rest of the wavelength regions passes through the anode 10 and may be sensed in the photo-sensing devices 50B and 50R.

A focusing lens (not shown) may be further formed on the organic photoelectronic device 100. The focusing lens may control a direction of incident light and gather the light in one region. The focusing lens may have a shape of, for example, a cylinder or a hemisphere, but is not limited thereto.

As aforementioned, the organic photoelectronic device 100 has a stacked structure and thus may reduce the size of an image sensor and realize a down-sized image sensor.

In addition, the organic photoelectronic device 100 includes the first auxiliary layer 40 as described above, and may not only improve external quantum efficiency (EQE) by applying a reverse bias to the organic photoelectronic device 100, but may also effectively reduce or prevent reverse transfer of holes from the cathode 20 to the light-absorption layer 30 and lower a dark current when the reverse bias is applied thereto. Accordingly, the organic photoelectronic device 100 may reduce signal noise of an image sensor and improve its detectivity.

In addition, as described above, the first auxiliary layer 40 is formed of an inorganic material capable of being thermally deposited, and thus may reduce or prevent thermal degradation of the light-absorption layer 30 in a process of forming the first auxiliary layer 40 and simultaneously protect the light-absorption layer 30 in a subsequent process requiring a high temperature of greater than or equal to about 150° C., for example, a process of forming a focusing lens, and resultantly reduce or prevent performance degradation of the organic photoelectronic device 100 and an image sensor including the organic photoelectronic device 100.

In FIG. 6, the organic photoelectronic device 100 of FIG. 1 is included, but it is not limited thereto, and thus the organic photoelectronic device 200 of FIG. 3 may be applied in the same manner.

As aforementioned, an organic photoelectronic device selectively absorbing light in a green wavelength region is illustrated, but the present inventive concepts are not limited thereto, and may include a structure in which an organic photoelectronic device selectively absorbing light in a blue wavelength region is stacked and a green photo-sensing device and a red photo-sensing device are integrated in the semiconductor substrate 110, or a structure in which an organic photoelectronic device selectively absorbing light in a red wavelength region is stacked and a green photo-sensing device and a blue photo-sensing device are integrated in the semiconductor substrate 110.

Figure 7:
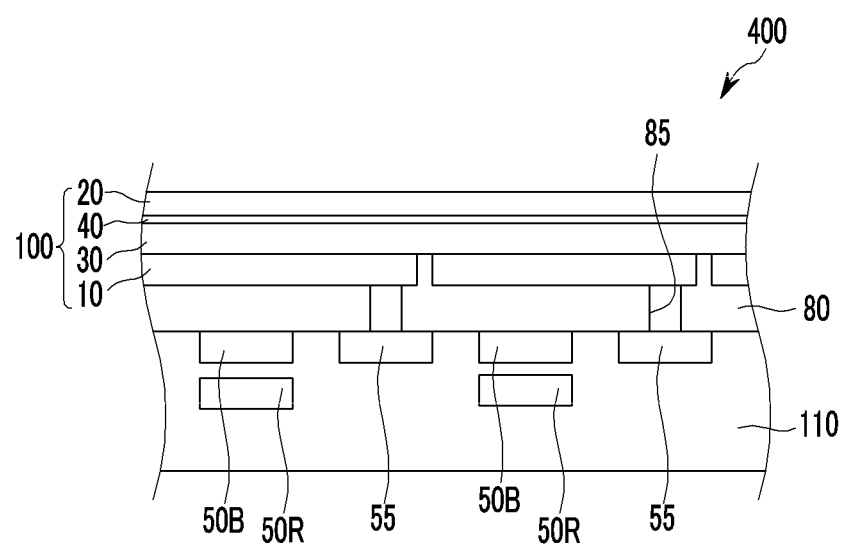
FIG. 7 is a schematic cross-sectional view showing an organic CMOS image sensor according to example embodiments.

FIG. 7 is a schematic cross-sectional view showing an organic CMOS image sensor according to example embodiments.

The organic CMOS image sensor 400 according to example embodiments includes a semiconductor substrate 110 integrated with photo-sensing devices 50B and 50R, a transmission transistor (not shown), a charge storage device 55, an upper insulation layer 80, and an organic photoelectronic device 100, like the example embodiment illustrated in FIG. 6.

However, the organic CMOS image sensor 400 according to example embodiments includes the photo-sensing devices 50B and 50R that are stacked in a vertical direction and does not include a color filter layer 70, unlike the example embodiment illustrated in FIG. 6. The photo-sensing devices 50B and 50R are electrically connected with the charge storage device 55, and the information of the charge storage device 55 may be transferred by the transmission transistor. The photo-sensing devices 50B and 50R may selectively absorb light in each wavelength region depending on a stack depth.

A focusing lens (not shown) may be further formed on the organic photoelectronic device 100. The focusing lens may control a direction of incident light and gather the light in one region. The focusing lens may have a shape of, for example, a cylinder or a hemisphere, but is not limited thereto.

The organic photoelectronic device selectively absorbing light in a green wavelength region is stacked as described above, and the red and blue photo-sensing devices are also stacked, which may reduce the size of an image sensor and realize a down-sized image sensor.

In addition, external quantum efficiency (EQE) of the organic photoelectronic device 100 may not only be improved by applying a reverse bias thereto, but the organic photoelectronic device 100 includes the first auxiliary layer 40 as described above and thus may effectively block reverse transfer of holes from the cathode 20 to the light-absorption layer 30 and decrease a dark current when the reverse bias is applied to the organic photoelectronic device 100. Accordingly, detectivity of an image sensor may be improved by reducing signal noise of the image sensor including the organic photoelectronic device 100.

In addition, as described above, the first auxiliary layer 40 is formed of an inorganic material capable of being thermally deposited, and thus may reduce or prevent thermal degradation of the light-absorption layer 30 in a process of forming the first auxiliary layer 40 and simultaneously effectively protect the light-absorption layer 30 in a subsequent process requiring a high temperature of greater than or equal to about 150° C., for example, a process of forming a focusing lens, and resultantly reduce or prevent performance degradation of the organic photoelectronic device 100 and an image sensor including the organic photoelectronic device 100.

In FIG. 7, the organic photoelectronic device 100 of FIG. 1 is included, but it is not limited thereto, and thus the organic photoelectronic device 200 of FIG. 3 may be applied in the same manner.

In FIG. 7, an organic photoelectronic device selectively absorbing light in a green wavelength region is illustrated, but the present inventive concepts are not limited thereto, and may have a structure in which an organic photoelectronic device selectively absorbing light in a blue wavelength region is stacked and a green photo-sensing device and a red photo-sensing device are integrated in a semiconductor substrate 110, or a structure in which an organic photoelectronic device selectively absorbing light in a red wavelength region is stacked and a green photo-sensing device and a blue photo-sensing device are integrated in the semiconductor substrate 110.

Figure 8:
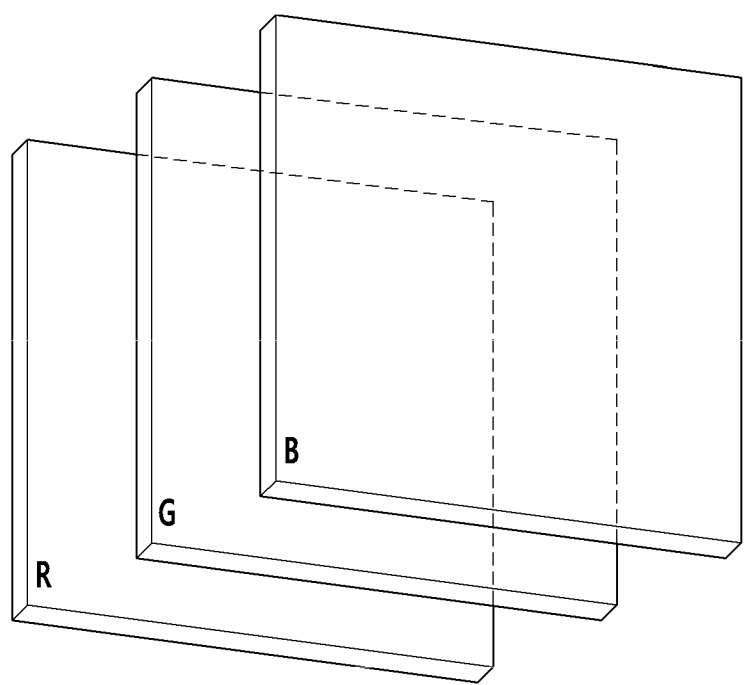
FIG. 8 is a schematic top plan view showing an organic CMOS image sensor according to example embodiments.
Figure 9:
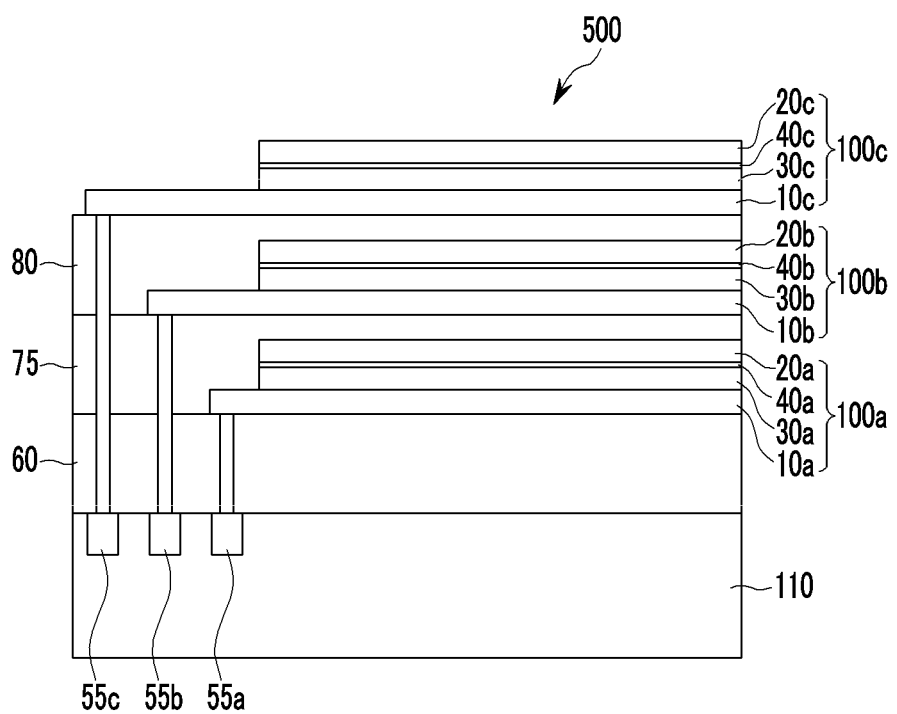
FIG. 9 is a cross-sectional view showing the organic CMOS image sensor of FIG. 8.

FIG. 8 is a schematic top plan view showing an organic CMOS image sensor according to example embodiments, and FIG. 9 is a cross-sectional view showing the organic CMOS image sensor of FIG. 8.

The organic CMOS image sensor 500 according to example embodiments includes a green photoelectronic device selectively absorbing light in a green wavelength region, a blue photoelectronic device selectively absorbing light in a blue wavelength region, and a red photoelectronic device selectively absorbing light in a green wavelength region, and they are stacked.

The organic CMOS image sensor 500 according to example embodiments includes a semiconductor substrate 110, a lower insulation layer 60, an intermediate insulation layer 75, an upper insulation layer 80, a first organic photoelectronic device 100a, a second organic photoelectronic device 100b, and a third organic photoelectronic device 100c.

The semiconductor substrate 110 may be a silicon substrate, and is integrated with the transmission transistor (not shown) and the charge storage devices 55a, 55b, and 55c.

A metal wire (not shown) and a pad (not shown) are formed on the semiconductor substrate 110, and the lower insulation layer 60 is formed on the metal wire and the pad.

The first organic photoelectronic device 100a is formed on the lower insulation layer 60.

The first organic photoelectronic device 100a includes an anode 10a and a cathode 20a facing each other, a light-absorption layer 30a between the anode 10a and the cathode 20a, and a first auxiliary layer 40a between the cathode 20a and the light-absorption layer 30a. The anode 10a, the cathode 20a, the light-absorption layer 30a, and the first auxiliary layer 40a are the same as described above, and the light-absorption layer 30a selectively absorbs light in one of red, blue, and green wavelength regions. For example, the first organic photoelectronic device 100a may be a red photoelectronic device.

The anode 10a, the light-absorption layer 30a, the first auxiliary layer 40a, and the cathode 20a are sequentially stacked in the drawing, but the present inventive concepts are not limited thereto, and the cathode 20a, the first auxiliary layer 40a, the light-absorption layer 30a, and the anode 10a may be disposed in order.

The intermediate insulation layer 75 is formed on the first organic photoelectronic device 100a.

The second organic photoelectronic device 100b is formed on the intermediate insulation layer 75.

The second organic photoelectronic device 100b includes an anode 10b and a cathode 20b facing each other, a light-absorption layer 30b between the anode 10b and the cathode 20b, and a first auxiliary layer 40b between the cathode 20b and the light-absorption layer 30b. The anode 10b, the cathode 20b, the light-absorption layer 30b, and the first auxiliary layer 40b are the same as described above, and the light-absorption layer 30b selectively absorbs light in one of red, blue, and green wavelength regions. For example, the second organic photoelectronic device 100b may be a blue photoelectronic device.

The drawing shows a structure in which the anode 10b, the light-absorption layer 30b, the first auxiliary layer 40b, and the cathode 20b are sequentially stacked, but it is not limited thereto, and the cathode 20b, the first auxiliary layer 40b, the light-absorption layer 30b, and the anode 10b may be disposed in order.

An upper insulation layer 80 is formed on the second organic photoelectronic device 100b. The lower insulation layer 60, the intermediate insulation layer 75 and the upper insulation layer 80 have a plurality of through-holes exposing the charge storage devices 55a, 55b, and 55c.

The third organic photoelectronic device 100c is formed on the upper insulation layer 80. The third organic photoelectronic device 100c includes an anode 10c and a cathode 20c facing each other, a light-absorption layer 30c between the anode 10c and the cathode 20c, and a first auxiliary layer 40c between the cathode 20c and the light-absorption layer 30c. The anode 10a, the cathode 20a, the light-absorption layer 30a, and the first auxiliary layer 40a are the same as described above, and the light-absorption layer 30c selectively absorbs light in one of red, blue, and green wavelength regions. For example, the third organic photoelectronic device 100c may be a green photoelectronic device.

A focusing lens (not shown) may be further formed on the organic photoelectronic device 100c. The focusing lens may control a direction of incident light and gather the light in one region. The focusing lens may have a shape of, for example, a cylinder or a hemisphere, but is not limited thereto.

The drawing shows a structure in which the anode 10c, the light-absorption layer 30c, the first auxiliary layer 40c, and the cathode 20c are sequentially stacked, but the present inventive concepts are not limited thereto, and the cathode 20c, the first auxiliary layer 40c, the light-absorption layer 30c, and the anode 10c may be disposed in order.

The drawing shows a structure in which the first organic photoelectronic device 100a, the second organic photoelectronic device 100b, and the third organic photoelectronic device 100c are sequentially stacked, but the present inventive concepts are not limited thereto, and the first organic photoelectronic device 100a, the second organic photoelectronic device 100b, and the third organic photoelectronic device 100c may be stacked in various orders.

In FIG. 9, the organic photoelectronic device 100 of FIG. 1 is included, but it is not limited thereto, and thus the organic photoelectronic device 200 of FIG. 3 may be applied in the same manner.

As aforementioned, the first organic photoelectronic device 100a, the second organic photoelectronic device 100b, and the third organic photoelectronic device 100c absorbing light in different wavelength regions have a stacked structure and thus may further reduce the size of an image sensor and realize a down-sized image sensor.

In addition, external quantum efficiency (EQE) is improved by applying a reverse bias to the organic photoelectronic devices 100a, 100b, and 100c, and as described above, the first auxiliary layers 40a, 40b, and 40c are respectively included therein, reverse transfer of holes is effectively reduced or prevented from the cathodes 20a, 20b, and 20c to light-absorption layers 30a, 30b, and 30c when the reverse bias is applied to the organic photoelectronic device 100, effectively decreasing a dark current. Accordingly, signal noise of an image sensor including the organic photoelectronic devices 100a, 100b, and 100c is reduced, and thus detectivity thereof may be improved.

In addition, as described above, the first auxiliary layers 40a, 40b, and 40c are formed of an inorganic material capable of being thermally deposited and thus may reduce or prevent thermal degradation of the light-absorption layers 30a, 30b, and 30c in a process of forming the first auxiliary layers 40a, 40b, and 40c and simultaneously effectively protect the light-absorption layers 30a, 30b, and 30c in a subsequent process requiring a relatively high temperature of greater than or equal to about 150° C., for example, a process of forming a focusing lens, and resultantly reduce or prevent performance degradation of an image sensor including the organic photoelectronic devices 100a, 100b, and 100c.

The image sensor may be applied to, for example, various electronic devices such as a mobile phone or a digital camera, but is not limited thereto.

Hereinafter, the present disclosure is illustrated in more detail with reference to examples. However, these are examples, and the present disclosure is not limited thereto.

Manufacture of Organic Photoelectronic Device

Example 1

A 150 nm-thick anode is formed on a glass substrate by sputtering ITO. Subsequently, on the anode, a 120 nm-thick light-absorption layer is formed by codepositing 2-((5-(naphthalene-1-yl(phenyl)amino)selenophene-2-yl)methylene)-1H-cyclopenta[b]naphthalene-1,3(2H)-dione and C60 in a ratio of 1:1. On the light-absorption layer, a 5 nm-thick upper auxiliary layer is formed by thermally depositing a manganese oxide (MnOx, 0<x≤2). On the upper auxiliary layer, a 50 nm-thick cathode is formed by sputtering ITO, manufacturing an organic photoelectronic device.

Example 2

A 150 nm-thick anode is formed on a glass substrate by sputtering ITO. On the anode, a 10 nm-thick lower auxiliary layer is formed by sputtering a molybdenum oxide (MoOx, 0<x≤3). On the lower auxiliary layer, a 120 nm-thick light-absorption layer is formed by codepositing 2-((5-(naphthalene-1-yl(phenyl)amino)selenophene-2-yl)methylene)-1H-cyclopenta[b]naphthalene-1,3(2H)-dione and C60 in a ratio of 1:1. On the light-absorption layer, a 3 nm-thick upper auxiliary layer is formed by thermally depositing a manganese oxide (MnOx, 0<x≤2). On the upper auxiliary layer, a 50 nm-thick cathode is formed by sputtering ITO, manufacturing an organic photoelectronic device.

Example 3

An organic photoelectronic device is manufactured according to the same method as Example 2, except for forming a 5 nm-thick upper auxiliary layer by thermally depositing a manganese oxide (MnOx, 0<x≤2).

Comparative Example 1

An organic photoelectronic device is manufactured according to the same method as Example 1, except for forming no upper auxiliary layer.

Comparative Example 2

An organic photoelectronic device is manufactured according to the same method as Example 2, except for forming no upper auxiliary layer.

Evaluation

Evaluation 1

External quantum efficiency (EQE) and a leakage current of each organic photoelectronic device according to Examples 1 to 3 and Comparative Examples 1 and 2 are evaluated.

The external quantum efficiency (EQE) is evaluated in a wavelength region ranging from 300 nm to 800 nm ($\lambda_{max}$=560 nm) in an incident photon to current efficiency (IPCE) method. The leakage current is evaluated by dark current density and detectivity, and herein, the dark current density may be measured by a current flowing when a −3 V reverse bias is applied thereto, and the detectivity is obtained by dividing the external quantum efficiency (EQE) by the dark current.

The results are provided in Table 1.

TABLE 1

| | $EQE_{560\ nm}$ (%) | Dark current density (−3 V, e/s/μm$^2$) | Detectivity (Jones) |
|---|---|---|---|
| Example 1 | 67 | 10,123 | $1.53 \times 10^{12}$ |
| Comparative Example 1 | 63 | 88,282 | $1.61 \times 10^{11}$ |
| Example 2 | 66 | 235 | $6.69 \times 10^{12}$ |
| Example 3 | 65 | 230 | $6.61 \times 10^{12}$ |
| Comparative Example 2 | 65 | 318 | $4.67 \times 10^{12}$ |

Referring to Table 1, the organic photoelectronic device according to Example 1 shows improved external quantum efficiency (EQE), dark current density, and detectivity compared with the one according to Comparative Example 1. Likewise, the organic photoelectronic devices according to Examples 2 and 3 have equivalent external quantum efficiency (EQE) to that of the organic photoelectronic device according to Comparative Example 2 but improved dark current density and detectivity.

Evaluation 2

The organic photoelectronic devices according to Examples 1 to 3 and Comparative Examples 1 and 2 are evaluated regarding heat resistance properties.

The heat resistance properties are evaluated by measuring by heat-treating the organic photoelectronic devices according to Examples 1 to 3 and Comparative Examples 1 and 2 at 160° C. for 1 h, and their external quantum efficiency (EQE) and leakage current changes.

The external quantum efficiency (EQE) changes are provided in Table 2, and their leakage current changes are provided in Table 3.

TABLE 2

| | $EQE_{560\ nm}$ (%) (@ 25° C.) | $EQE_{560\ nm}$ (%) (160° C., 1 h) |
|---|---|---|
| Example 1 | 67 | 68 |
| Comparative Example 1 | 63 | 63 |
| Example 2 | 66 | 66 |
| Example 3 | 65 | 66 |
| Comparative Example 2 | 65 | 65 |

TABLE 3

| | Dark current density (@ 25° C.) (e/s/μm$^2$) | Dark current density (160° C., 1 h) (e/s/μm$^2$) | Dark current density change (e/s/μm$^2$) |
|---|---|---|---|
| Example 1 | 10,123 | 2055 | 8068 |
| Comparative Example 1 | 88,282 | 105,849 | 17,567 |
| Example 2 | 235 | 2330 | 2095 |
| Example 3 | 230 | 2492 | 2262 |
| Comparative Example 2 | 318 | 6955 | 6637 |

Referring to Tables 2 and 3, the organic photoelectronic device according to Example 1 shows equivalent external quantum efficiency to that of the organic photoelectronic device according to Comparative Example 1, and a relatively small dark current density increase after a heat treatment at a relatively high temperature. For example, the organic photoelectronic device according to Example 1 shows a dark current density increase of less than or equal to about 50% compared with that of the organic photoelectronic device according to Comparative Example 1.

Likewise, the organic photoelectronic devices according to Examples 2 and 3 show equivalent external quantum efficiency changes to that of the organic photoelectronic device according to Comparative Example 2, but relatively small dark current density increases after a heat treatment at a relatively high temperature. For example, the organic photoelectronic devices according to Examples 2 and 3 shows a dark current density increase of less than or equal to about 50% compared with that of the organic photoelectronic device according to Comparative Example 2.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectronic device comprising:
   an anode and a cathode facing each other;
   a light-absorption layer between the anode and the cathode; and
   a first auxiliary layer between the cathode and the light-absorption layer, the first auxiliary layer having an energy bandgap of about 3.0 eV to about 4.5 eV, and a difference between a work function of the cathode and a highest occupied molecular orbital (HOMO) energy level of the first auxiliary layer is about 1.5 eV to about 2.0 eV,
   wherein the first auxiliary layer includes one of iron manganese oxide, cobalt manganese oxide, iron chromium oxide, cobalt chromium oxide, iron cobalt oxide, and a combination thereof.

2. The organic photoelectronic device of claim 1, wherein the HOMO energy level of the first auxiliary layer is greater than a HOMO energy level of the light-absorption layer and the work function of the cathode.

3. The organic photoelectronic device of claim 2, wherein the HOMO energy level of the first auxiliary layer is greater than or equal to about 6.3 eV.

4. The organic photoelectronic device of claim 1, wherein a lowest unoccupied molecular orbital (LUMO) energy level of the first auxiliary layer is less than a LUMO energy level of the light-absorption layer and the work function of the cathode.

5. The organic photoelectronic device of claim 4, wherein the LUMO energy level of the first auxiliary layer is greater than or equal to about 2.0 eV.

6. The organic photoelectronic device of claim 5, wherein the LUMO energy level of the first auxiliary layer is about 2.0 eV to about 2.9 eV.

7. The organic photoelectronic device of claim 1, wherein the energy bandgap of the first auxiliary layer is about 3.4 eV to about 4.3 eV.

8. The organic photoelectronic device of claim 1, wherein the first auxiliary layer includes an inorganic material to provide a thin film having light transmittance of greater than or equal to about 70% by thermal evaporation.

9. The organic photoelectronic device of claim 1, wherein the first auxiliary layer has a thickness of about 0.1 nm to about 20 nm.

10. The organic photoelectronic device of claim 1, further comprising:
    a second auxiliary layer between the anode and the light-absorption layer,
    wherein the second auxiliary layer includes one of a molybdenum-containing oxide, a tungsten-containing oxide, a vanadium-containing oxide, a rhenium-containing oxide, a nickel-containing oxide, a copper-containing oxide, and a combination thereof.

11. The organic photoelectronic device of claim 1, wherein the light-absorption layer and the first auxiliary layer contact each other.

12. An organic photoelectronic device comprising:
    an anode and a cathode facing each other;
    a light-absorption layer between the anode and the cathode; and
    a first auxiliary layer between the cathode and the light-absorption layer, the first auxiliary layer including at least one of a manganese-containing oxide, a chromium-containing oxide, and a cobalt-containing oxide,
    wherein the manganese-containing oxide is one selected from iron manganese oxide, cobalt manganese oxide, and a combination thereof, the chromium-containing oxide is one selected from iron chromium oxide, cobalt chromium oxide, and a combination thereof, and the cobalt-containing oxide is iron cobalt oxide.

13. The organic photoelectronic device of claim 12, wherein a highest occupied molecular orbital (HOMO) energy level of the first auxiliary layer is greater than a HOMO energy level of the light-absorption layer and a work function of the cathode.

14. The organic photoelectronic device of claim 12, wherein a lowest unoccupied molecular orbital (LUMO) energy level of the first auxiliary layer is less than a LUMO energy level of the light-absorption layer and a work function of the cathode.

15. The organic photoelectronic device of claim 12, further comprising:
    a second auxiliary layer between the anode and the light-absorption layer,
    wherein the second auxiliary layer includes one of a molybdenum-containing oxide, a tungsten-containing oxide, a vanadium-containing oxide, a rhenium-containing oxide, a nickel-containing oxide, a copper-containing oxide, and a combination thereof.

16. The organic photoelectronic device of claim 12, wherein the light-absorption layer and the first auxiliary layer contact each other.

17. An image sensor comprising the organic photoelectronic device of claim 1.

18. An image sensor comprising the organic photoelectronic device of claim 12.

* * * * *